US007536018B2

(12) United States Patent
Onishi et al.

(10) Patent No.: US 7,536,018 B2
(45) Date of Patent: May 19, 2009

(54) ACTIVE NOISE CANCELLATION SYSTEM

(75) Inventors: Masahide Onishi, Osaka (JP); Yoshio Nakamura, Neyagawa (JP); Toshio Inoue, Wako (JP); Akira Takahashi, Wako (JP)

(73) Assignees: Panasonic Corporation, Osaka (JP); Honda Motor Co., Ltd., Tokyo (JP)

( * ) Notice: Subject to any disclaimer, the term of this patent is extended or adjusted under 35 U.S.C. 154(b) by 958 days.

(21) Appl. No.: 10/936,600

(22) Filed: Sep. 9, 2004

(65) Prior Publication Data

US 2005/0053244 A1 Mar. 10, 2005

(30) Foreign Application Priority Data

Sep. 10, 2003 (JP) ............................ 2003-318362

(51) Int. Cl.
*H03B 29/00* (2006.01)
*H04B 15/00* (2006.01)

(52) U.S. Cl. .................. 381/71.8; 381/71.11; 381/71.1; 381/71.4; 381/71.12; 381/71.14; 381/94.1; 381/94.9

(58) Field of Classification Search ..... 381/71.1–71.14, 381/94.1–94.9, 86
See application file for complete search history.

(56) References Cited

U.S. PATENT DOCUMENTS 5,278,780 A * 1/1994 Eguchi ....................... 708/322
5,377,276 A * 12/1994 Terai et al. ............... 381/71.11
5,388,160 A * 2/1995 Hashimoto et al. ....... 381/71.14
5,488,667 A 1/1996 Tamamura et al.
5,586,190 A * 12/1996 Trantow et al. .......... 381/71.12
5,710,822 A * 1/1998 Steenhagen et al. ...... 381/71.12

(Continued)

FOREIGN PATENT DOCUMENTS

GB 2 257 601 A 1/1993

(Continued)

OTHER PUBLICATIONS

Sem M Kuo et al, "*Integrated Automotive Signal Processing and Audio System*", Transactions On Consumer Electronics, Aug. 1, 1993, pp. 522-561, vol. 39, No. 3.

*Primary Examiner*—Vivian Chin
*Assistant Examiner*—Devona E. Faulk
(74) *Attorney, Agent, or Firm*—Arent Fox LLP

(57) ABSTRACT

In an active noise cancellation system having an adaptive filter that outputs a control signal, first and second speakers that emit a canceling signal generated based on the control signal, a microphone that detects an error signal, a correction filter that corrects the base signal by a correction value to generate a reference signal and a filter coefficient updater that successively updates the adaptive filter coefficient based on the error signal and reference signal such that the error signal is minimized, the correction value of the correction filter is set to a sum obtained by adding the transfer characteristic from the first speaker to the microphone, and a product obtained by multiplying the transfer characteristic from the second speaker to the microphone by the prescribed value, thereby enabling to reduce the number of microphones and avoid the increase in parts, the amount of work to provide complicated wiring to the microphones, and the computational load involved in updating the adaptive filter coefficient, while enabling to maintain an area in which noise can be reduced to the same level as that obtained before reducing the number of microphones.

5 Claims, 17 Drawing Sheets

U.S. PATENT DOCUMENTS 6,418,228 B1 * 7/2002 Terai et al. ................. 381/71.8

FOREIGN PATENT DOCUMENTS

JP 1-501344 5/1989
JP 03-203495 A 9/1991
JP 06-332477 12/1994
WO WO 88/02912 4/1988
WO WO 91/12608 A1 8/1991

* cited by examiner

P: UNKNOWN SYSTEM

W: VALUE TO BE DETERMINED: $W=-\frac{P}{C}$ e: SIGNAL FROM MICROPHONE: $e=PX+WCX$

Δ: SLOPE OF MEAN SQUARE ERROR $$\Delta=\frac{\partial(e^2)}{\partial W}$$

$$=2\cdot e\cdot\frac{\partial e}{\partial W}$$

$$=2\cdot e\cdot C\cdot X$$

BOOMING NOISE $= a' \cos(2\pi ft) + jb' \sin(2\pi ft)$ f: FREQUENCY OF BOOMING NOISE

FIG. 11

| f | CR | CI |
|---|---|---|
| 30 | 3 | -2 |
| · | · | · |
| 40 | 5 | -1 |
| 41 | 13 | 0 |
| 42 | 40 | 5 |
| 43 | 62 | 17 |
| · | · | · |
| · | · | · |
| 200 | -27 | 18 |
| · | · | · |
| 230 | -12 | -49 |

FIG. 12

| f | FR | FI |
|---|---|---|
| 30 | 16 | 22 |
| · | · | · |
| 40 | 10 | 38 |
| 41 | 7 | 49 |
| 42 | 11 | 89 |
| 43 | 18 | 102 |
| · | · | · |
| · | · | · |
| 200 | -33 | 65 |
| · | · | · |
| 230 | -50 | 28 |

ACTIVE NOISE CANCELLATION SYSTEM

BACKGROUND OF THE INVENTION

1. Field of the Invention

The present invention relates to an active noise cancellation system, and more specifically relates to a system for emitting or outputting a signal (sound or vibration) that cancels out the vibration or noise (or vibration-induced noise) in the passenger compartment of a vehicle, the cabin of an aircraft, or the like, and controlling that signal so that vibration or noise is effectively canceled or minimized by the resultant interference.

2. Description of the Related Art

Systems have been proposed as active noise cancellation systems whereby a noise-canceling signal is emitted or outputted from a speaker or the like by using a digital signal processing technique, and the noise at a listening position (evaluation point) at which a microphone or the like is installed is reduced (see Japanese Domestic Republication No. 1-501344 that is corresponding to PCT/GB87/00706 (FIG. 1 and others) and Japanese Laid-Open Patent Application No. 6-332477 (FIG. 1 and others)).

The technique described in Japanese Domestic Republication No. 1-501344 is configured such that a plurality of speakers as canceling signal emitters and microphones as error signal detectors are disposed in the passenger compartment of a vehicle, the cabin of an aircraft, or another enclosed space, and noise is reduced in the entire enclosed space of the vehicle passenger compartment or the like.

Specifically, this type of noise cancellation system essentially employs feedforward control using an adaptive filter to emit a signal from a speaker so as to minimize an error signal that indicates residual vibration or noise due to the interference between a noise and the canceling signal in the mounting position of the microphone, and therefore has the drawback of being incapable of adequately reducing noise that is located away from the microphone.

The technique described in Japanese Domestic Republication No. 1-501344 is therefore designed such that the control area in which noise can be reduced is extended from a point to a space, and noise can be reduced throughout an enclosed area by installing a plurality of microphones and performing control such that the summation of the error signals detected by each microphone is minimized.

SUMMARY OF THE INVENTION

However, because the microphones are generally mounted to the inside of the roof (ceiling) or to the seat backs (rear surfaces of the seats) in order to reduce noise near occupants' ears, increasing the number of microphones not only increases the number of parts, but leads to an increase in work to provide complicated wiring to the microphones and in the computational load involved in updating the filter coefficient of the adaptive filter, and contributes to increased cost.

A technique is proposed in Japanese Laid-Open Patent Application No. 6-332477 for reducing noise in a position other than the mounting position of the microphone (evaluation point). As shown particularly in FIG. 1 of this publication, a technique is proposed whereby a filter circuit (FIR) 5 is provided between the adaptive filter 2 and the second speaker 6*b*, and noise at a control point (point A) other than the microphone mounting position is reduced by the output of the second speaker 6*b* by setting the filter coefficient of the filter circuit to the transfer characteristic G from the microphone (error detection means) 1*b* to the point (point A) controlled by the second speaker. Specifically, using the passenger compartment of a vehicle as an example, the technique disclosed in this prior art ('477) is a technique whereby noise is reduced at the control point (point A) on the rear seat merely by using the microphone used for the front seats.

However, although the transfer characteristic C from the first speaker 6*a* to the microphone 1*b* is set as the filter coefficient of the FIR filter 3, and the transfer characteristic from the second speaker 6*b* to the control point (point A) is approximated by the same characteristic as C in the active noise cancellation system disclosed in ('477), since only the transfer characteristic G from the microphone 1*b* to the control point (point A) is set as the filter coefficient of the filter circuit 5, this technique has drawbacks in that the microphone 1*b* is actually affected by the output sound from the second speaker 6*b* to make it impossible to effectively reduce noise at the mounting position of the microphone 1*b*, and also the control point (point A) is affected by the output sound from the first speaker 6*a* to make it impossible to reduce noise at the control point in an effective manner.

In other words, the active noise cancellation system disclosed in FIG. 1 of ('477) has the drawback of not being able to effectively reduce noise because neither the transfer characteristic from the first speaker 6*a* to the control point (point A), nor the transfer characteristic from the second speaker 6*b* to the mounting position of the microphone 1*b*, or the so-called cross term, is taken into account in the filter coefficient of the filter circuit 5.

Therefore, an object of the present invention is to overcome the above-mentioned drawbacks, and to provide an active noise cancellation system that is configured so as to reduce the number of microphones for error signal detection and avoid the above-mentioned increase in parts, the increase in the amount of work to provide complicated wiring to the microphones, and the increase in the computational load involved in updating the filter coefficient of the adaptive filter, while enabling to maintain an area in which noise can be reduced to the same level as that obtained before reducing the number of microphones.

In order to achieve the object, there is provided an active noise cancellation system, comprising: a base signal generator that generates a base signal composed of a harmonic having a frequency selected from a frequency of vibration or noise produced from a vibration or noise source; an adaptive filter that outputs a control signal based on the base signal; a first canceling signal emitter that emits a canceling signal for canceling out the vibration or noise generated based on the control signal; an error signal detector that detects a residual vibration or noise at an evaluation point due to interference between the emitted canceling signal and the produced vibration or noise, as an error signal; a correction filter that corrects the base signal, by a correction value indicating a transfer characteristic of the produced vibration or noise that corresponds to the harmonic frequency of the base signal from the first canceling signal emitter to the error signal detector, to generates a reference signal; a filter coefficient updater that successively updates a filter coefficient of the adaptive filter based on the error signal and the reference signal such that the error signal is minimized; a compensation filter that corrects the control signal by a prescribed value; and a second canceling signal emitter that emits the canceling signal generated based on the corrected control signal, wherein the correction value of the correction filter is set to a sum obtained by adding the transfer characteristic from the first canceling signal emitter to the error signal detector, and a product obtained by multiplying the transfer characteristic from the second canceling signal emitter to the error signal detector by the prescribed value.

BRIEF DESCRIPTION OF THE DRAWINGS

The above and other objects and advantages of the invention will be more apparent from the following description and drawings, in which:

FIG. 11 is a diagram showing the table characteristics for each frequency of the filter characteristic C of the correction filter used in the control algorithm illustrated in FIG. 10;

FIG. 12 is a diagram showing the table characteristics for each frequency of the filter coefficient F of the compensation filter used in the control algorithm illustrated in FIG. 10;

DESCRIPTION OF THE PREFERRED EMBODIMENTS

Preferred embodiments for carrying out the active noise cancellation system according to the present invention will be described hereinafter with reference to the accompanying drawings.

Figure 1:
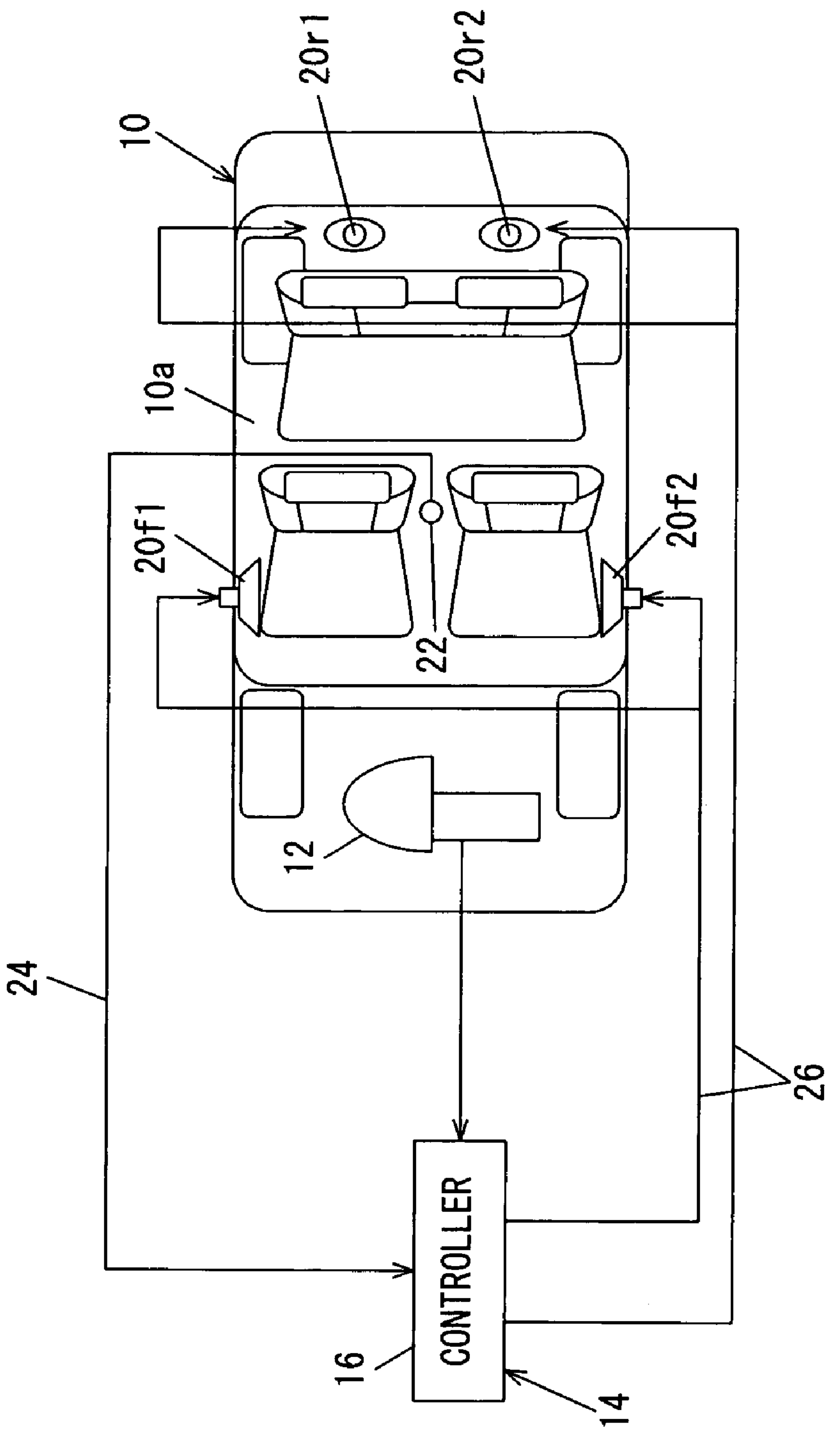
FIG. 1 is a schematic plan view of a vehicle on which an active noise cancellation system according to a first embodiment of the present invention is mounted.
Figure 2:
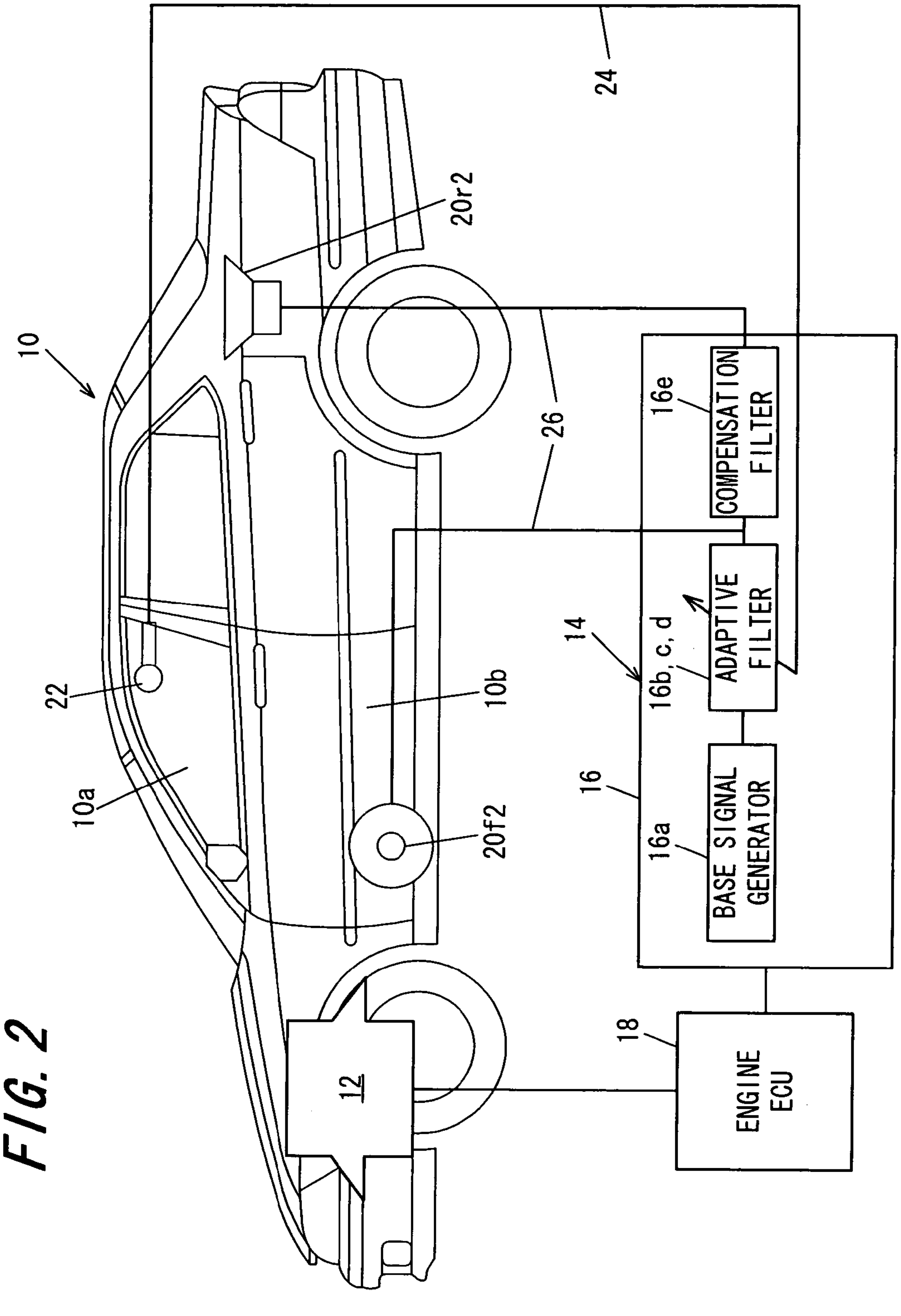
FIG. 2 is a side view of the vehicle illustrated in FIG. 1 and showing the configuration of a controller of the system illustrated in FIG. 1.

FIG. 1 is a schematic plan view of a vehicle (automobile) on which an active noise cancellation system according to a first embodiment of the present invention is mounted and FIG. 2 is a side view of the vehicle illustrated in FIG. 1 and showing the configuration of a controller of the system illustrated in FIG. 1. Thus, the active noise cancellation system according to the first embodiment is shown as an example of a case in which noise in the passenger compartment of a vehicle is reduced.

In FIGS. 1 and 2, "10" indicates the vehicle, or, specifically, a four-wheeled vehicle. A four-cylinder, four-cycle internal combustion engine (noise source; hereinafter simply referred to as "engine") 12 in which gasoline is used as fuel is mounted at the front in the travel direction of the vehicle 10. The area to the rear of the mounting position of the engine 12 in the vehicle 10 is partitioned off, and a passenger compartment **10*a* is formed. The passenger compartment 10*a*** is formed in airtight fashion to construct an enclosed space. Here, the terms "vibration or noise" or "vibration noise" are used in this specification to indicate a meaning that includes at least one of vibration, noise, and vibration-induced noise.

An active noise cancellation system 14 is mounted in the passenger compartment **10*a*. The active noise cancellation system 14 is provided with a controller 16, a group (two) of speakers 20*f*1 and 20*f*2 in the door panels 10*b* on both sides of the front seats, a group (two) of speakers 20*r*1 and 20*r*2 in the rear tray behind the rear seats, and a single microphone 22** embedded in the interior material of the roof (not shown) in the position directly above the middle of the front seats.

The controller 16 is composed of a microcomputer and is provided with a CPU, a memory, a counter, and other components (not shown). The controller 16 is contained in the instrument panel (not shown) in front of the front seats. An engine ECU (Electronic Control Unit) 18 also composed of a microcomputer is provided at an appropriate position of the vehicle 10 to receive outputs of various sensors including crank angle sensor (not shown) and controls the fuel injection and ignition timing of the engine 12. The engine ECU 18 generates a pulse (NE pulse) signal indicating the engine speed NE from the output of the crank angle sensor transmitted to the controller 16 or from an ignition signal prepared by itself.

Based on the inputted pulse signal, the controller 16 generates a base signal (in sine wave) made up a harmonic having a frequency, for example, of the second harmonic, selected from the fundamental frequency or frequencies (NE, fundamental wave) of the noise produced by the noise source (engine) 12. Booming noise (sound) is the dominant factor of the noise in the passenger compartment, and the frequency thereof corresponds to substantially twice the engine speed NE in a four-cylinder engine, and substantially three times the engine speed in a six-cylinder engine. Accordingly, the harmonic of the base signal should be determined or generated according to the number of cylinders in the onboard engine 12 (four cylinders in this embodiment). The booming noise is a sound emitted as the engine vibration generated by the combustion of gas fuel in the cylinders is transmitted to the vehicle body and excites the vehicle body panels.

The microphone 22 is connected to the controller 16 via a cable (indicated schematically by a line 24). The microphone detects or records noise (i.e., the error signal described hereinafter) and produces a signal indicative of the detected noise to the controller 16. The controller 16 computes a control signal to cancel or reduce the noise using an adaptive filter, etc., on the basis of these inputs as described hereinafter, converts the control signal to a drive signal for the two groups (four) of speakers 20, and outputs the drive signal to the two groups (four) of speakers 20 via a cable (indicated schematically by a line 26), whereby a canceling signal is emitted or outputted from the speakers 20. In that case, the drive signal outputted to the one group of speakers **20*f*1 and 20*f*2 at the front seats is shared (i.e., the same value), and the drive signal outputted to the one group of speakers 20*r*1 and 20*r*2** at the rear seats is also shared (i.e., the same value).

The signal outputted from the microphone 22 is actually inputted to the controller 16 via an amplifier, a band-pass filter, and an A/D converter, but these components are omitted from the depiction in FIGS. 1 and 2. Similarly, a D/A converter, a low-pass filter, and an amplifier are interposed between the controller 16 and the speakers 20, but these components are also omitted from the drawings.

The four speakers 20 are configured so as to also function as the speakers for the audio device (not shown) of the vehicle 10. Specifically, a configuration is adopted whereby a terminal for inputting the drive signal is provided to the audio head unit (not shown) of the audio device, a connection is formed with the controller 16, and the controller 16 drives the speakers 20 via the main amplifier (not shown) of the audio device.

The configuration or operation of the active noise cancellation system according to the present embodiment will be further described.

Figure 3:
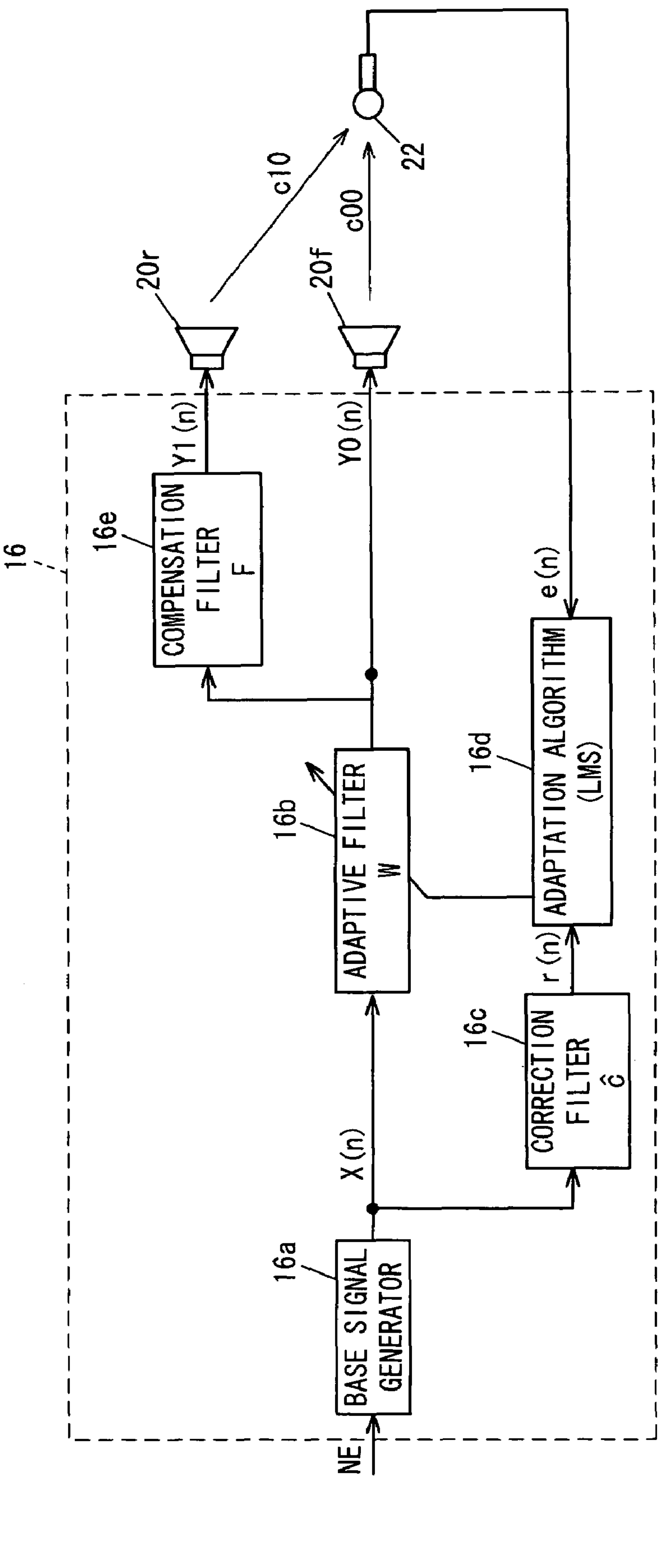
FIG. 3 is a block diagram showing the configuration and operation of the controller illustrated in FIGS. 1 and 2 in detail.
Figure 4:
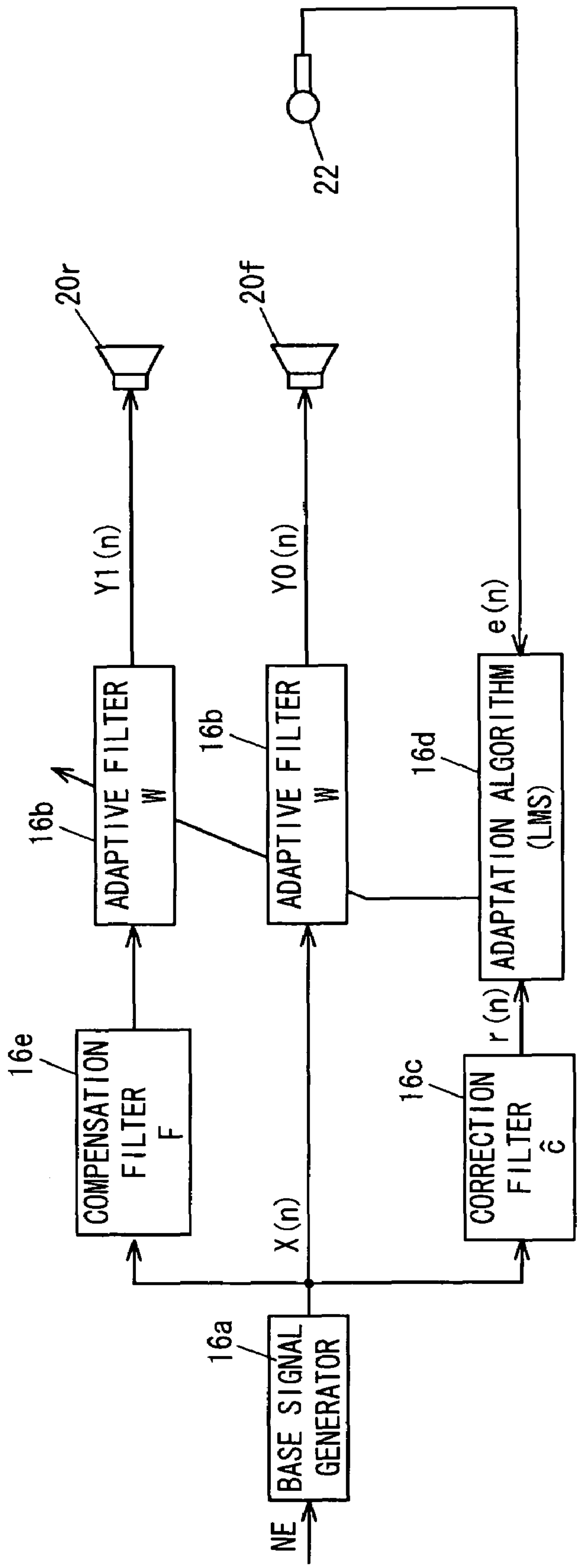
FIG. 4 is a block diagram equivalent to FIG. 3.

FIG. 3 is a block diagram showing the configuration and operation of the controller 16 in detail. In this figure, the configuration and operation of the controller 16 is shown in terms of the function of the algorithm of the program stored in the memory thereof. FIG. 4 is also a block diagram equivalent to that of FIG. 3.

As shown in FIG. 3, this system has a base signal generator **16*a* that generates the base signal (now assigned with the symbol "X") composed of a harmonic having a frequency selected from the fundamental frequency of the noise produced by the noise source, an adaptive filter 16*b* that outputs the control signal (now assigned with the symbol "Y0") on the basis of the base signal X, the two groups (i.e., a plurality) of speakers (canceling signal emitters) 20*f* (20*f*1 and 20*f*2) and 20*r* (20*r*1 and 20*r*2) that emit or output the canceling signal for canceling out the noise generated based on the control signal, the single microphone (error signal detector) 22 that detects as an error signal e the residual vibration noise due to the interference between the noise and the canceling signal at the position (evaluation point) directly above the center of the front seats, a correction filter 16*c* that corrects the base signal by a correction value c indicating the transfer characteristic (signal transfer characteristic) of the noise that corresponds to the frequency of the base signal X, from the speakers (canceling signal emitters) 20 to the microphone (error signal detector) 22, to generate a reference signal r, and an adaptive algorithm (LMS, or filter coefficient updater) 16*d* that successively or continuously updates a filter coefficient W of the adaptive filter 16*b* on the basis of the error signal e and the reference signal r such that the error signal e is minimized. The system is also provided with a compensation filter 16*e*** that corrects the control signal by a prescribed value (filter coefficient) F.

In the configuration shown in the diagram, a sine wave that is synchronized with the engine rotation, or, more specifically, that has the same frequency as the frequency of the booming noise described above, is generated as the base signal X, and the phase and amplitude thereof are converted or transformed by the adaptive filter **16*b* and outputted as the control signal Y0. The filter coefficient W of the adaptive filter 16*b* is prepared in advance by experimentation to be stored in the aforementioned memory as a parameter, and is updated by the adaptive algorithm 16*d* from the output (reference signal r) of the correction filter 16*c* designed by modeling the acoustic characteristics inside the passenger compartment 10*a* and from the error signal e detected by the microphone 22 so as to minimize the mean square value of e. The speakers 20 are driven by the drive signal generated based on the control signal, and the noise inside the passenger the mean square value of the error signal (noise signal) e generated from the output of the microphone 22. Specifically, the frequency of the noise (booming noise) is estimated based on the engine speed NE, the base signal synchronized therewith is generated, and the base signal is converted into the canceling signal (specifically, the control signal) that cancels the noise by using the adaptive digital filter. A configuration is adopted whereby this canceling signal is emitted into the inside of the passenger compartment 10*a* by the main amplifier and speakers 20** that are shared with the audio system, and the noise is reduced or canceled.

A characteristic feature of this system resides in that the speakers (canceling signal emitters) 20 are composed of speakers (first canceling signal emitter) **20*f* provided at the front seats that emit or output a sound generated based on the control signal Y0 as the canceling signal and speakers (second canceling signal emitter) 20*r* provided at the rear seats that emit or output a sound as the canceling signal generated based on a control signal Y1 corrected by the compensation filter 16*e*, or, more specifically, the control signal Y1 obtained by correcting the filter coefficient W of the adaptive filter 16*b* by the filter coefficient (prescribed value) F of the compensation filter 16*e*. Furthermore, the system is configured such that the correction value (filter coefficient) c of the correction filter 16*c* is set to the sum (=c00+F·c10) obtained by adding together the transfer characteristic c00 from the speakers (first canceling signal emitter) 20*f* at the front seats to the microphone (error signal detector) 22 and the product (F·c10) obtained by multiplying the transfer characteristic c10 from the speakers (second canceling signal emitter) 20*r* at the rear seats to the microphone (error signal detector) 22** by the prescribed value F.

In the figure, the hat assigned on c indicates an estimated value, but this is omitted in the description. The subscript (n) indicates the sample number of a discreet system, or, specifically, the control cycle of the controller 16, but is also generally omitted from the description.

The above will be described with reference to FIG. 16.

This figure is a block diagram obtained by applying the technique described in the aforesaid prior art ('344) to the configuration of the embodiment shown in FIG. 1 such that a microphone 220 is added to the rear seats, so as to show the transfer characteristic between the speakers and the microphones.

Figure 16:
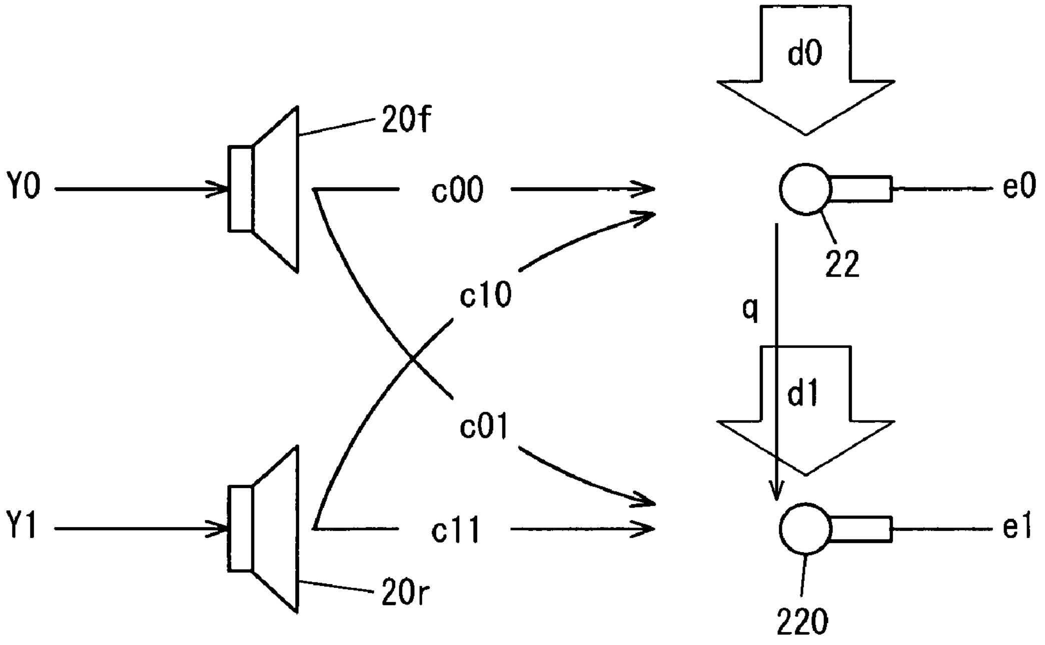
FIG. 16 is a view, similar to FIG. 6, but showing the transfer characteristic between the speakers and microphones in the prior art system.

In FIG. 16, if the noise (booming noise) at the front seats is designated as d0 and the noise (booming noise) at the rear seats is designated as d1, the transfer characteristics from each speaker to each microphone can be indicated as illustrated, and based thereon, noise can be reduced over the whole area of the passenger compartment **10*a*** by performing control so as to minimize the aggregate of the error signals detected by each microphone in accordance with an adaptive feedforward control algorithm that uses the same adaptive digital filter as described above.

However, in this configuration, the number of parts increases, more work needs to be performed to provide complex wiring to the microphones, the computational load involved in updating the filter coefficient of the adaptive filter also increases, and other drawbacks occur as described above.

A technique is disclosed in the second prior art ('477) for reducing noise also at the control point (point A; mounting position of the microphone 220 in FIG. 16) at the rear seats by using solely the microphone 1*b* at the front seats. Although the transfer characteristic C from the speakers 6*a* at the front seats to the microphone 1*b* (22 in FIG. 16) is set as the filter coefficient of the FIR filter 3, and the transfer characteristic from the rear-seat speakers 6*b* to the control point (point A) is approximated by the same characteristic C, since only the transfer characteristic G from the microphone 1*b* to the control point (point A) is set as the filter coefficient of the filter circuit 5, in other words, since the transfer characteristic from the speakers 6*a* at the front seats to the control point (point A) at the rear seats, or the transfer characteristic from the speakers 6*b* at the rear seats to the mounting position of the microphone 1*b* at the front seats, or the so-called cross term (indicated by c01 and c10 in FIG. 16), is not taken into account by the filter coefficient of the FIR filter 3, this technique has the drawback of not being able to effectively reduce noise.

Therefore, in the active noise cancellation system according to the present embodiment shown in FIGS. 3 and 4, the number of microphones as the error signal detector is reduced to avoid the above-mentioned increase in the number of parts, the increase in work to provide complex wiring to the microphones and the increase in the computational load involved in updating the filter coefficient of the adaptive filter, and the same area of noise reduction capability is maintained as had existed prior to reducing the number of microphones at the evaluation point.

This configuration will be described hereinafter.

Figure 17:
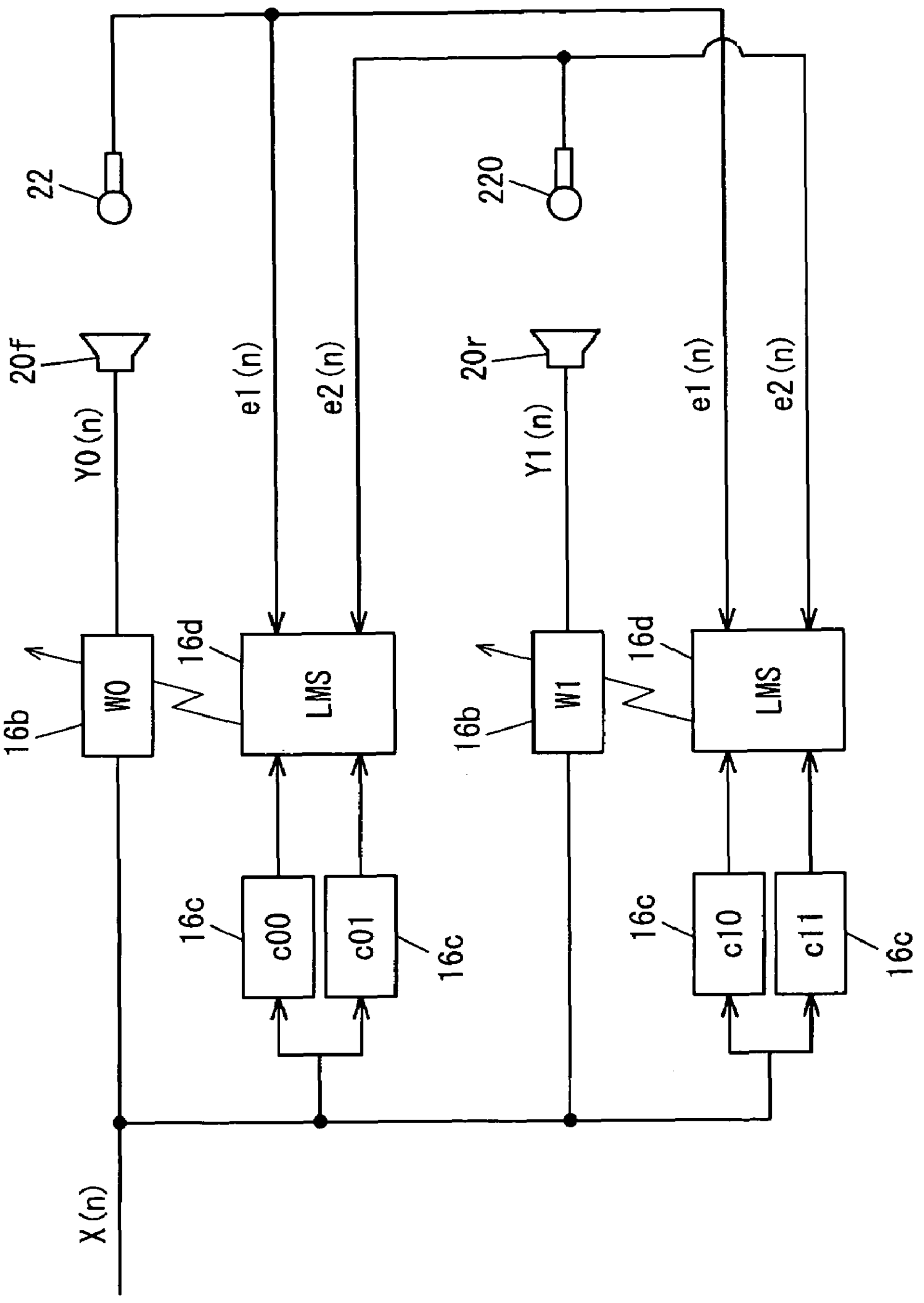
FIG. 17 is a block diagram showing the configuration of the prior art system illustrated in FIG. 16.

If shown as a block diagram, the configuration of the prior art ('344) provided with two microphones can be shown as in FIG. 17. In contrast, as shown in FIGS. 3 and 4, the number of microphones is reduced to one in the system according to the present embodiment, and the configuration illustrated in FIGS. 3 and 4 becomes as that shown in FIG. 5 when illustrated by a block diagram comparable to FIG. 17.

Figure 5:
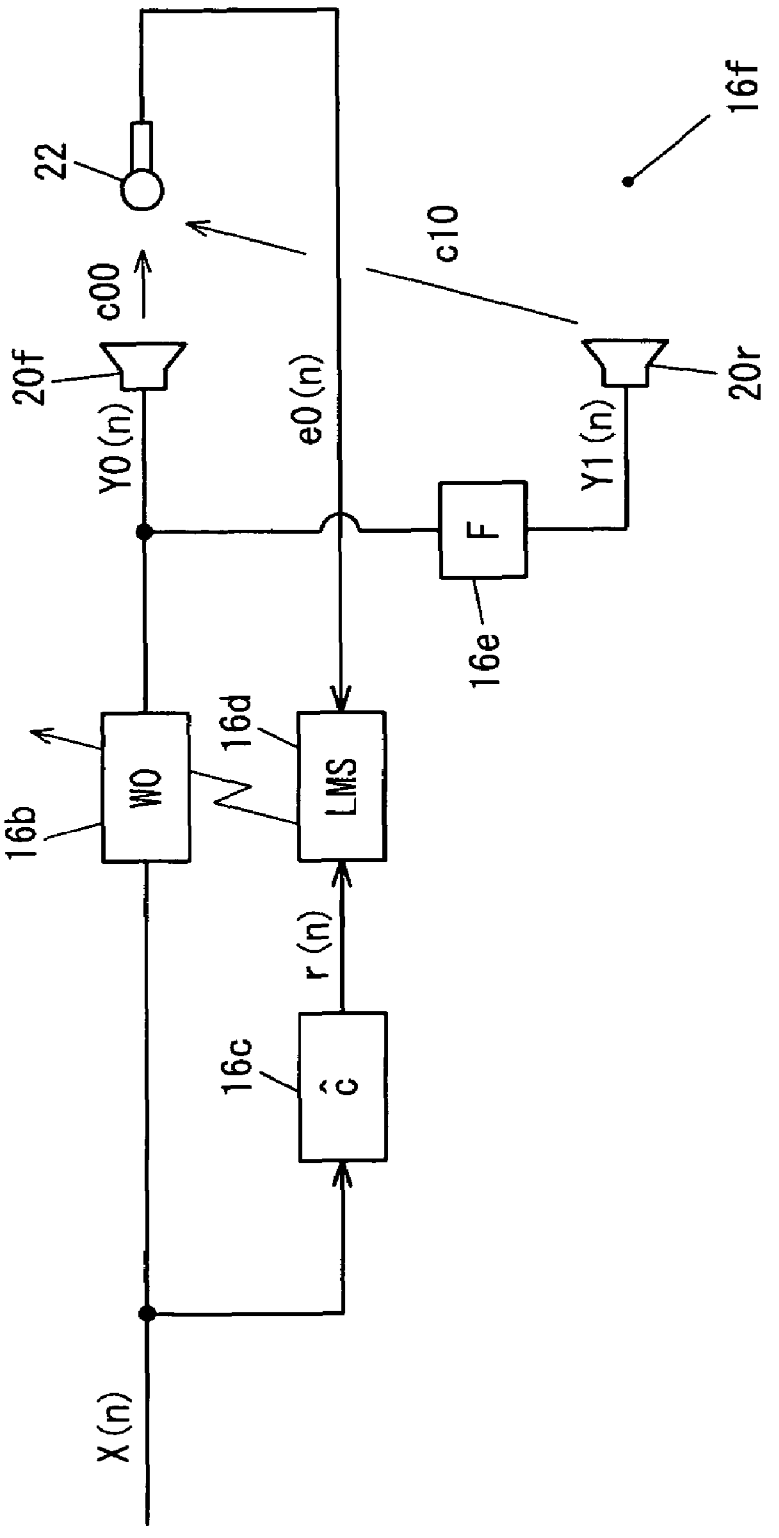
FIG. 5 is a block diagram equivalent to FIGS. 3 and 4.

In FIG. 5, if it is assumed that the filter coefficient (correction value) c of the correction filter 16*c* indicates the transfer characteristic from the output of the adaptive filter 16*b* to the LMS (adaptive algorithm) 16*d*, and when the input (output of the adaptive filter 16*b*) of the front-seat speakers 20*f* is designated or defined as Y0, the input of the rear-seat speakers 20*r* is designated as Y1, the transfer characteristic from the front-seat speakers 20*f* to the microphone 22 is designated as c00, the transfer characteristic from the rear-seat speakers 20*r* to the microphone 22 is designated as c10, and the prescribed value (filter coefficient) of the compensation filter 16*e* is designated as F as described above, a canceling signal Y'0 (not shown) from the front-seat speakers 20*f* when it has reached the microphone 22 becomes Y'0=c00·Y0. Also, a canceling signal Y'1 from the rear-seat speakers 22*r* when it has reached the microphone 22 becomes Y'1=c10·Y1.

Since a signal to which the aforementioned canceling signals are added by the microphone 22 is inputted to the LMS (adaptive algorithm) 16*d*, the input signal of the LMS (adaptive algorithm) 16*d* is as shown below.

$$Y'0+Y'1=c00\cdot Y0+c10\cdot Y1 \qquad \text{(Eq. 1)}$$

Equation (1) can be modified as shown below using Y1=F·Y0.

$$\begin{aligned} c00\cdot Y0+c10\cdot Y1 &= c00\cdot Y0+c10\cdot F\cdot Y0 \qquad \text{(Eq. 2)}\\ &= Y0\cdot(c00+F\cdot c10) \end{aligned}$$

Hence, c can be expressed as in the following equation.

$$c=(c00+F\cdot c10) \qquad \text{(Eq. 3)}$$

A configuration is thus adopted in the system according to the present embodiment such that the correction value c of the correction filter 16*c* is made as the sum (c00+c01·F) obtained by adding together the transfer characteristic c00 from the speakers (first canceling signal emitter) 20*f* at the front seats to the microphone (error signal detector) 22 to the product (c01·F) of the transfer characteristic c10 from the speakers (second canceling signal emitter) 20*r* at the rear seat to the microphone (error signal detector) 22 and the prescribed value F (that is the filter coefficient of the compensation filter 16*e*).

Computation of the filter coefficient (prescribed value) F of the compensation filter 16*e* will next be described using FIG. 6.

Figure 6:
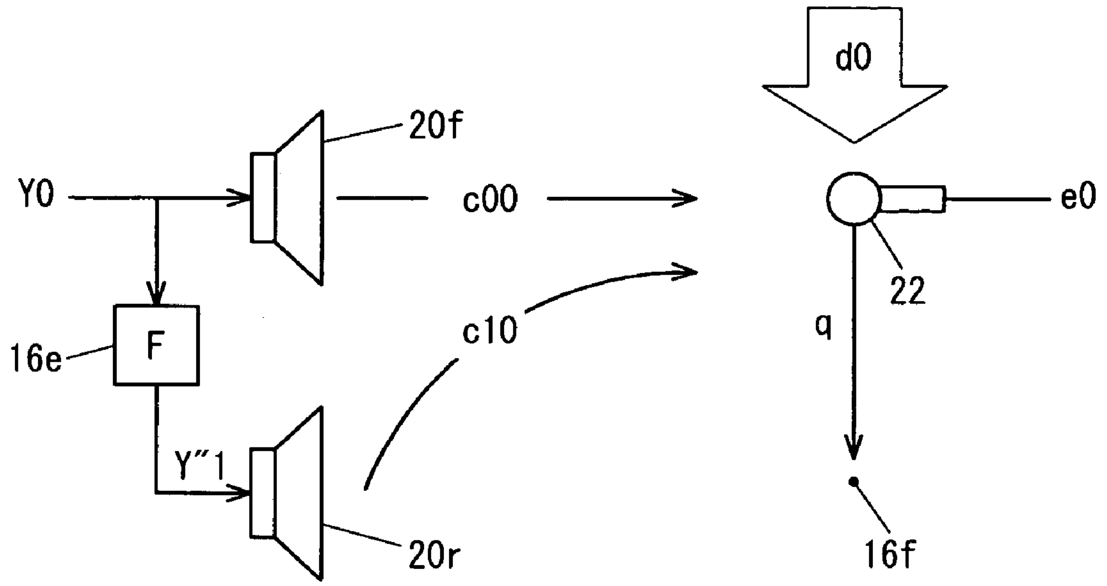
FIG. 6 is a block diagram showing the transfer characteristics between the speakers and microphone illustrated in FIG. 1 to FIG. 5.

FIG. 6 is a block diagram, similar to FIG. 16, but showing the transfer characteristic between the speakers and microphone.

In view of the fact that the drawback of the prior art ('477) lies in its lack of consideration for the cross term, the noise (i.e., increased sound) produced at the rear seats can be suppressed during reduction of the noise at the front seats by computing the prescribed value F such that the canceling signal at the rear seats cancels the signal (generated by the canceling signal at the front seats that has reached the rear seats in accordance with the transfer characteristic (cross term c01 shown in FIG. 16)), as expressed by the following equation.

$$F=c11/c01 \qquad \text{(Eq. 4)}$$

Specifically, the canceling signal from the speakers 20*f* can be canceled or counteracted by the canceling signal from the speakers 20*r* at a pseudo or simulated evaluation point 16*f* and the noise (increased sound) generated at the rear seats can be inhibited, by setting the filter coefficient (prescribed value) F of the rear-seat compensation filter 16*e* so as to be determined based on the ratio of the transfer characteristic c01 from the speakers (first canceling signal emitter) 20*f* to the pseudo or simulated evaluation point 16*f* (the mounting position of the second microphone 220 in the prior art as shown in FIG. 16) set at a position apart from the mounting position (evaluation point) of the microphone 22, and the transfer characteristic c11 from the speakers (second canceling signal emitter) 20*r* to the pseudo or simulated evaluation point 16*f*.

The adaptive control (on which the system according to the present embodiment is based) will now be described in general terms with reference to FIG. 7.

Figure 7:
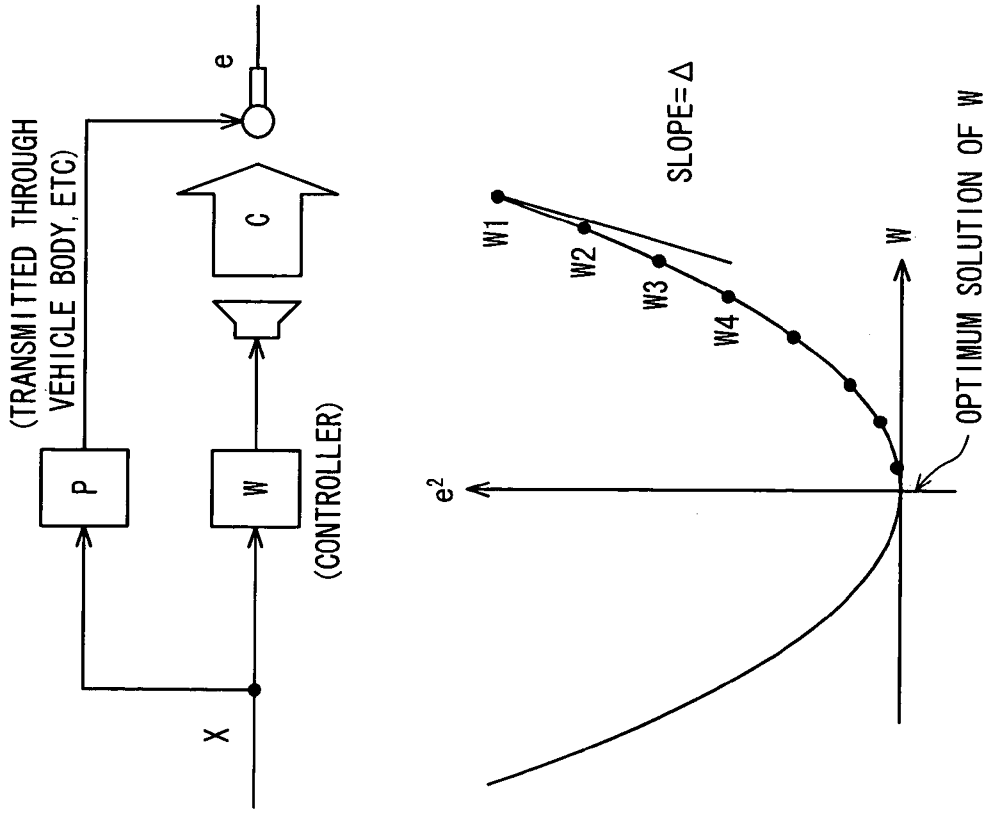
FIG. 7 is a set of views showing the adaptive control on which the system illustrated in FIG. 1 and onward is based.

The error signal e can be expressed as shown in FIG. 7, where P is an unknown system, W is the value to be determined (specifically, the filter coefficient of the adaptive filter 16*b*), and C is the speaker-to-microphone transfer characteristic. The slope Δ of the mean square value of the error signal e can also be expressed by the equation shown in FIG. 7. Control may thus be performed so as to approach the optimum solution by repeating the computation in equation (5) below. In the equation, μ indicates a step size parameter (an infinitesimal value).

$$W(n+1)=W(n)-\mu\cdot e(n)\cdot C\cdot X(n) \qquad \text{(Eq. 5)}$$

On the basis of this type of adaptive control, the base signal X to be generated in response to the frequency of the booming noise is multiplied by the transfer characteristic c in the configuration shown in FIG. 3 or 4, and a reference signal r is generated. The reference signal r is multiplied by the error signal e and the step size parameter μ, and the resultant product is subtracted from the current value of the filter coefficient W (which corresponds to the value to be determined in FIG. 7) of the adaptive filter 16*b*, whereby the next value is computed and the filter coefficient of the adaptive filter 16*b* is updated. Specifically, the filter coefficient of the adaptive filter 16*b* is successively or continuously updated by the adaptive algorithm 16*d* so that the error signal e is minimized. The speakers 20*f* and 20*r* are driven by the drive signal generated on the basis of the output (control output) Y0 of the adaptive filter 16*b*, and residual noise due to interference with the booming noise is detected by the microphone 22. It should be noted that the filter coefficients W of the two adaptive filters 16*b* in FIG. 4 are made identical.

As described above, the active noise cancellation system according to the present embodiment is provided with the compensation filter 16*e* whereby the control signal Y0 outputted from the adaptive filter 16*b* is corrected with the filter coefficient (prescribed value) F, the speakers 20 are composed of speakers (first canceling signal emitter) 20*f* at the front seats that output the cancel signal generated based on the control signal Y0 and speakers (second canceling signal emitter) 20*r* at the rear seats that output the canceling signal generated based on the control signal Y1 corrected by the filter coefficient (prescribed value) F of the compensation filter 16*e*, and the correction value of the correction filter 16*c* is made as the sum obtained by adding together the transfer characteristic c00 from the speakers (first canceling signal emitter) 20*f* to the microphone (error signal detector) 22 and product of the transfer characteristic c10 from the speakers 20*r* to the microphone 22 and the filter coefficient (prescribed value) F. With this, the number of microphones as error signal detector can be reduced, specifically, from two to one, and the above-mentioned increase in the number of parts, the increase in work to provide complex wiring to the microphones, and the increase in the computational load involved in updating the filter coefficient of the adaptive filter 16*b* can be avoided.

Specifically, it is possible to dispense with the microphone used for the rear seats, the harness connecting it to the controller 16, the process of installation thereof, the power circuit of the rear-seat microphone inside the controller 16, the amplifier/filter circuit, and the like. Furthermore, the computation or processing load on the controller 16 can be alleviated, and a proportionately less advanced and expensive computer can be used.

Furthermore, since the filter coefficient (prescribed value) F of the compensation filter 16*e* is configured so as to be determined on the basis of the ratio of the transfer characteristic c01 from the speakers 20*f* to the pseudo or simulated evaluation point 16*f* set at a position apart from the mounting position (evaluation point) of the microphone 22 and the transfer characteristic c11 from the speakers 20*r* to the pseudo or simulated evaluation point 16*f*, the canceling signal from the speakers 20*f* can be canceled or counteracted at the pseudo or simulated evaluation point 16*f* by the canceling signal from the speakers 20*r*, and the noise (increased sound) generated at the rear seats by the speakers 20*f* can be suppressed.

Furthermore, by setting the correction value c of the correction filter 16*c* such that $c=c00+c01\cdot F$, the filter coefficient W of the adaptive filter 16*b* is successively or continuously updated such that the error signal at the evaluation point (mounting position of the microphone 22) is minimized by the canceling signal from the speakers 20*f* and the canceling signal from the speakers 22*r*. As a result, the optimum noise cancellation can be obtained at the evaluation point. With the configuration described above, substantially the same area of noise reduction capability can be maintained as was obtained prior to reducing the number of microphones 22.

The active noise cancellation system according to a second embodiment of the present invention will next be described.

A configuration is adopted in the active noise cancellation system according to the second embodiment whereby the filter coefficient (transfer characteristic) c of the correction filter 16*c* and the filter coefficient (characteristic; corresponds to prescribed value) F of the compensation filter 16*e* are prepared for each frequency and stored in the memory in advance so as to be retrieved by the frequency of the base signal X.

Describing this configuration, in the prior art ('344), control is performed to reduce noise according to the same adaptive feedforward control algorithm using an adaptive digital filter as described with reference to FIG. 3 such that the error signal detected by the microphone is minimized.

In the prior art, since sound or vibration is considered in a time domain in addition to the problem of the number of microphones, a high-performance, high-cost computational processor is needed and other problems are encountered because of the heavy use of convolution computations (like vector multiplication) to compute the filter coefficient of the FIR filter. In view of this, a configuration is adopted in the system according to the second embodiment whereby sound or vibration is considered in a frequency domain, the amount of computation needed to determine the filter coefficient is reduced, and the desired effects can be obtained with a less advanced and expensive computational processor.

To describe further, since the booming noise is synchronized with the engine rotation, it has a waveform with a narrow frequency range, or, in other words, is nearly sinusoidal, the booming noise of each frequency can be expressed as the sum of a sine wave (sin) and a cosine wave (cos) orthogonal thereto. Therefore, the booming noise can be expressed in the complex plane shown in FIG. 8 as:

$$a'\cos(2\pi ft)+j\cdot b'\sin(2\pi ft)$$

using the orthogonal signal (f: frequency of booming noise).

Figure 9:
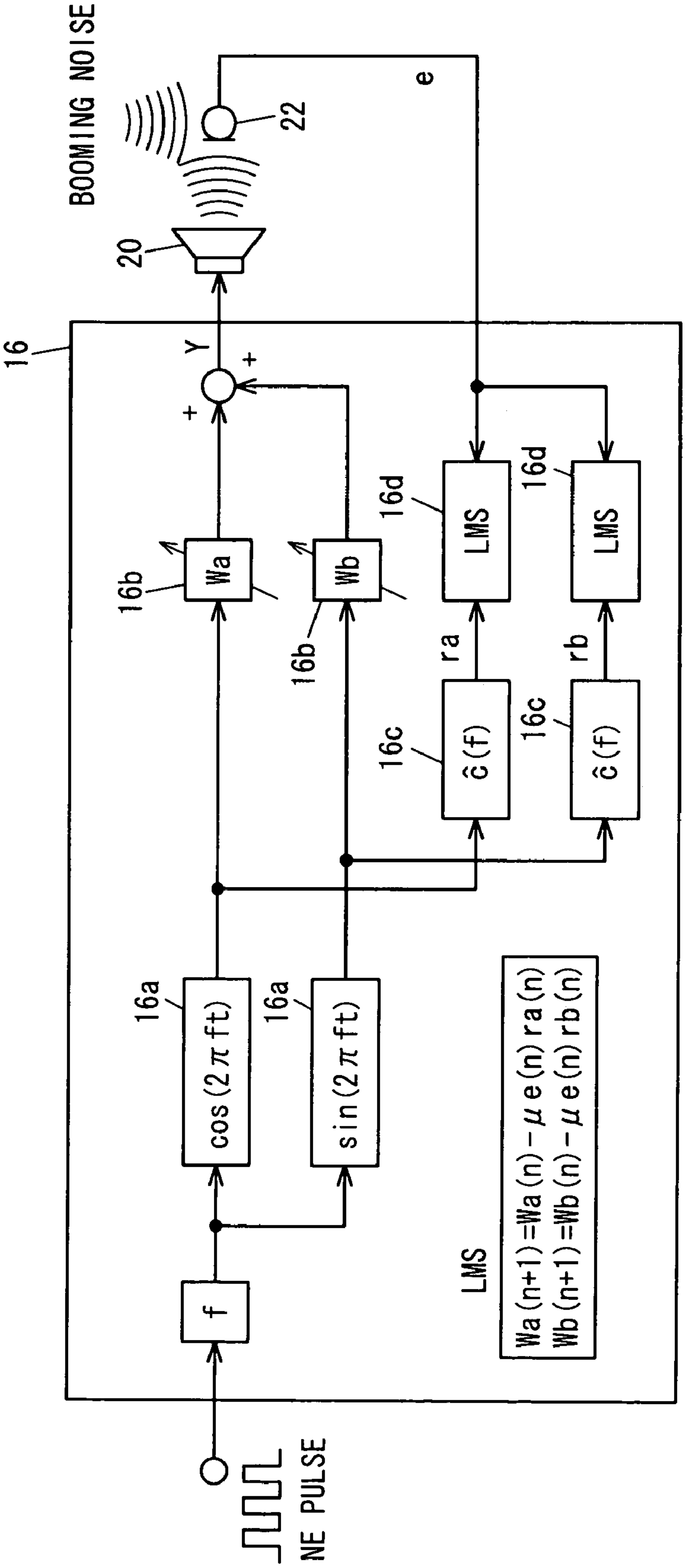
FIG. 9 is a block diagram showing the control algorithm performed based on the base signal expressed by the signal illustrated in FIG. 8.

When the booming noise is expressed as the sum of a sine wave (sin) and a cosine wave (cos) orthogonal thereto, the correspondingly generated base signal can also be decomposed and expressed as a sine wave and a cosine wave in the same manner, and the control algorithm thereof can be expressed as shown in FIG. 9.

In the configuration shown in the diagram, the cosine wave component and the sine wave component are each multiplied by the signal transfer characteristic c, and reference signals ra and rb are generated. The reference signals are multiplied by the error signal e and the step size parameter μ, and the resultant product is subtracted from the current value of filter coefficients Wa and Wb (that correspond to W in FIG. 3) of the adaptive filter 16*b*, whereby the next values of Wa and Wb are computed, and the filter coefficient of the adaptive filter 16*b* is updated. The output (control output) Y of the adaptive filter 16*b* is added in an addition step as shown in the figure, the speakers 20 are driven by the added value thus obtained, and the residual noise due to interference with the booming noise is detected by the microphone 22.

This is a technique whereby a notch filter used in eliminating booming noise of a narrow frequency band is utilized in the adaptive control algorithm, and the filter coefficients Wa and Wb, that correspond to the coefficients of orthogonal signals, are caused to follow the engine speed change by digital signal processing. This technique is known as a SAN (Single-frequency Adaptive Notch).

Figure 8:
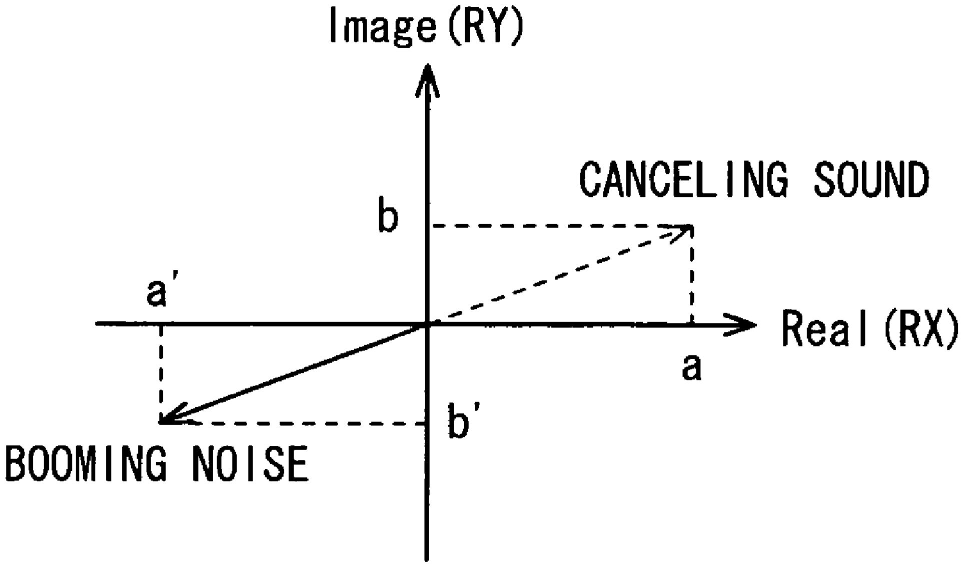
FIG. 8 is a diagram showing the complex plane in which the noise (booming noise) is indicated by an orthogonal signal in the system illustrated in FIG. 1.

As is clear from FIG. 8, if an RX signal (base cosine wave signal) and an RY signal (base sine wave signal) are used as the base signals on a real axis and an imaginary axis, it can be understood that the canceling signal or counteracting sound signal can be expressed in the same manner as a vector that has two coefficients in which the coefficient of the RX signal is designated as "a," and the coefficient of the RY signal on the imaginary axis is designated as "b."

As described above, in order to reduce the C·X computational processing of the equation for determining the slope Δ of the mean square error in FIG. 7, the transfer characteristic c from the speakers 20 to the microphone 22 is frequency analyzed and prepared or preserved as table values that can be retrieved by the frequency f to be controlled, specifically, by the frequency f of the base signal, as described above. In that case, the transfer characteristic c at the frequency f can be expressed using a complex number expression with i as an imaginary unit, as shown below (capital letters indicate vector matrices).

$$C(f)=CR(f)+j\cdot CI(f) \quad \text{(Eq. 6)}$$

In the above equation, CR(r) is the cosine wave component of the transfer characteristic of the sound with frequency f, and CI(f) is the sine wave component of the transfer characteristic of the sound with frequency f.

Therefore, c·X is as shown below.

$$\begin{aligned} c\cdot X &= C(f)\cdot[RX(f)+j\cdot RY(f)] \quad \text{(Eq. 7)}\\ &= [CR(f)+j\cdot CI(f)]\cdot[RX(f)+j\cdot RY(f)]\\ &= CR(f)RX(f)+j\cdot CI(f)\cdot RX(f)+j\cdot\\ &\quad CR(f)\cdot RY(f)-CI(f)\cdot RY(f)\\ &= [CR(f)RX(f)-CI(f)\cdot RY(f)]+j\cdot\\ &\quad [CR(f)\cdot RY(f)+CI(f)\cdot RX(f)] \end{aligned}$$

Continuing the expression with reference to FIG. 9, the above equation can be rewritten as shown below when the real part and the imaginary part of the reference signal (that is the signal in which the transfer characteristics are taken into account) are designated as "ra" and "rb," respectively.

$$ra=CR(f)\cdot RX(f)-CI(f)\cdot RY(f) \quad \text{(Eq. 8)}$$

$$rb=CR(f)\cdot RY(f)-CI(f)\cdot RX(f) \quad \text{(Eq. 9)}$$

Figure 10:
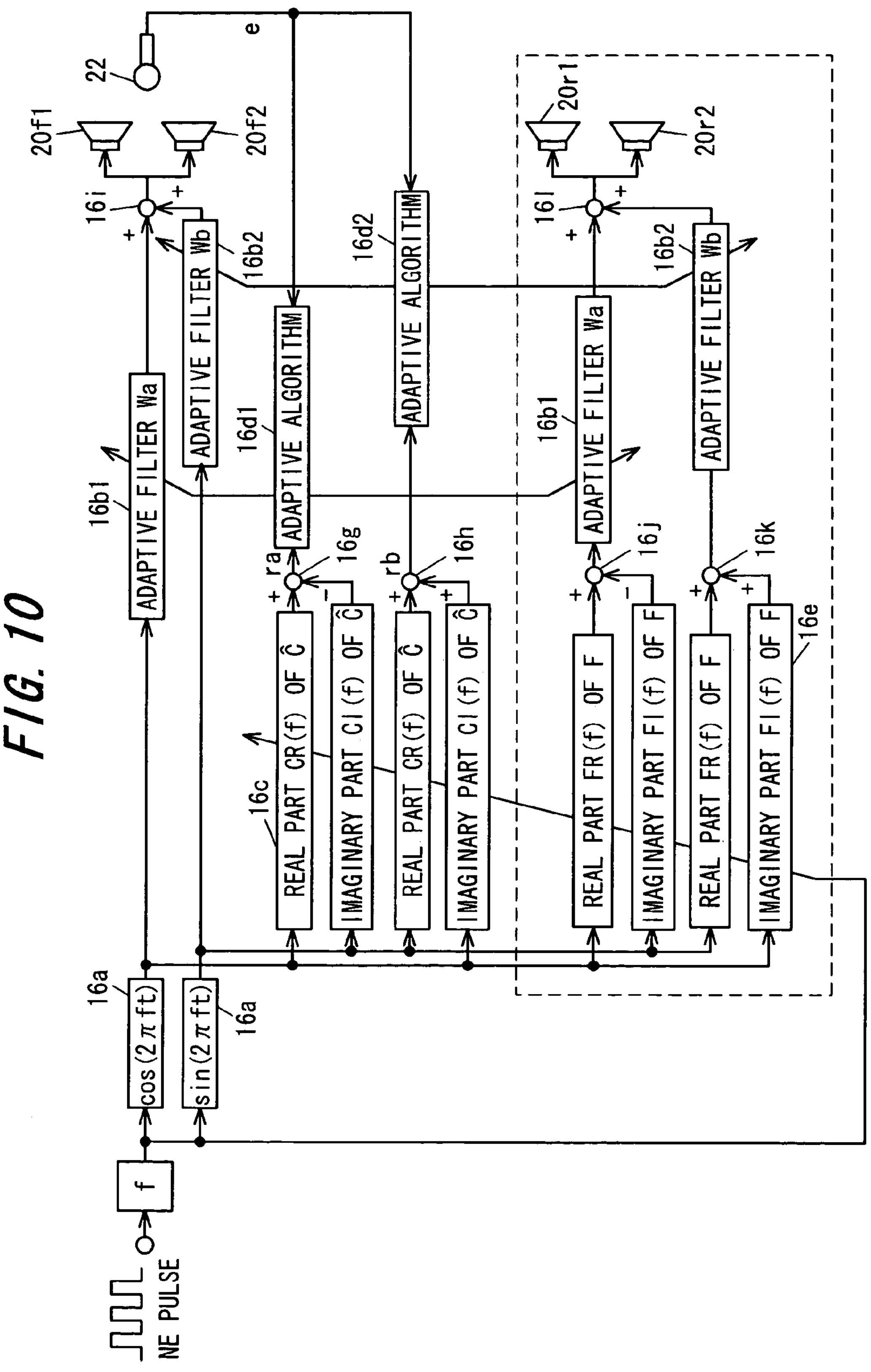
FIG. 10 is a block diagram showing the configuration and operation of the active noise cancellation system according to a second embodiment of the present invention, with emphasis on the controller and the control algorithm illustrated in FIG. 9 in more detail.

A block diagram using equations (8) and (9) is shown in FIG. 10. The table characteristics for each frequency of the characteristic c are shown in FIG. 11. In the figure, CR indicates the real part (cosine wave component) and CI indicates the imaginary part (sine wave component).

The technique that uses a SAN will be briefly described.

The frequency f (that is the subject of the control) is determined based on the engine speed NE, and the base cosine wave signal (cos(2πft)=RX) and base sine wave signal (sin (2πft)=RY) of the frequency f are generated as base signals. The CR and CI are read (retrieved) from the table (whose characteristic is shown in FIG. 11) in response to the determined frequency f, and the reference signals ra and rb are generated using equations (8) and (9).

The filter coefficient Wa of the adaptive filter **16*b*1 for the base cosine wave signal and the filter coefficient Wb of the adaptive filter 16*b*2 for the base sine wave signal are then determined using equation (5) from the reference signals ra and rb and the error signal e. After the control signals from the adaptive filters 16*b*1 and 16*b*2 are added together, the result is outputted from the front-seat speakers 20*f*1 and 20*f*2 as the canceling signal. By adopting this type of SAN technique, the filter coefficients can be computed without performing convolution computations and with a little multiplication and addition, and the computational load of the controller 16** can be reduced.

Similarly, if the filter coefficient F of the compensation filter **16*e*** is also designed in the frequency domain, this coefficient can be expressed with a complex number as shown in the following equation.

$$F(f)=FR(f)+j\,FI(f) \quad \text{(Eq. 10)}$$

The filter coefficient F of the rear-seat compensation filter **16*e* is also a table value for a frequency f the same as in the case of c, this value is divided into a real part FR (cosine wave component) and an imaginary part FI (sine wave component) and stored as shown in FIG. 12, such that a value corresponding to the frequency f of the generated base signal is retrieved and used in computation. The need for configuring the compensation filter 16*e* with a FIR filter is thus eliminated, and as described above, the corrected control signal that is to be outputted to the rear-seat speakers 20*r*1 and 20*r*2** can be computed without performing convolution computations and with a little multiplication and addition.

Describing the configuration shown in FIG. 10, a harmonic selected from the frequency f of the noise generated from the engine (noise source) 12, for example, the second harmonic in the case of the four cylinder engine, is selected, and a corresponding base signal with a frequency that can be expressed as two types of components comprising a cosine wave (cos) and a sine wave (sin) is generated by the base signal generator **16*a***.

The real part CR and imaginary part CI of the filter coefficient (transfer characteristic) C of the correction filter **16*c* with a frequency that corresponds to the frequency of the base signal thus generated are retrieved from the table shown in FIG. 11, the retrieved values are multiplied by the cosine wave component and the sine wave component for the adaptive filter 16*b*1, the difference is computed at a subtraction step 16*g* for the resultant product, and the reference signal ra is generated. The filter coefficient Wa of the adaptive filter 16*b*1 is updated as described by the reference signal ra and error signal e by the adaptive algorithm 16*d*1**.

At the same time, the retrieved values are multiplied by the cosine wave component and the sine wave component for the adaptive filter **16*b*2, the sum is computed at an addition step 16*h* for the resultant product, and the reference signal rb is generated. The filter coefficient Wb of the adaptive filter 16*b*2 is updated as described above by the reference signal rb and error signal e by the adaptive algorithm 16*d*2. The outputs (control signals) of the adaptive filters 16*b*1 and 16*b*2 are added together at an addition step 16*i*, and the drive signal of the front-seat speakers 20*f* is generated on the basis of the resultant sum and outputted as the canceling signal. The residual vibration noise that occurs due to the interference of the booming noise and the canceling signal generated from the base signal is detected by the microphone 22 as the error signal e and inputted to the adaptive algorithms 16*d*1 and 16*d*2**.

On the other hand, the real part FR and imaginary part FI of the filter coefficient F of the compensation filter **16*e* corresponding to the frequency of the generated base signal are retrieved from the table shown in FIG. 12, the retrieved values are multiplied by the cosine wave component and the sine wave component, the difference is computed at a subtraction step 16*j* for the resultant product, and the filter coefficient Wa of the adaptive filter 16*b*1** is multiplied by that difference.

At the same time, the products obtained by multiplying the retrieved values by the cosine wave component and the sine wave component are added together at an addition step **16*k*, a sum is computed, and the filter coefficient Wb of the adaptive filter 16*b*2 is multiplied by that sum. The outputs (control signals) of the adaptive filters 16*b*1 and 16*b*2 for which the filter coefficient F was multiplied (corrected) are added together at an addition step 161, and the drive signal of the rear-seat speakers 20*r*** is generated based on the resultant sum and outputted as the canceling signal.

As described above, in the active noise cancellation system according to the second embodiment, since the filter coefficient F of the compensation filter **16*e* and the transfer characteristic c corresponding to the filter coefficient of the correction filter 16*c* are stored in the memory of the controller 16 so as to be retrievable by the frequency of the base signal X, in addition to the effects described in the first embodiment, the computational load of the controller 16** can also be alleviated, and a much less advanced and expensive microcomputer on the order of an 8-bit device, for example, can be used.

The active noise cancellation system according to a third embodiment of the present invention will next be described.

The technique for designing the system according to the third embodiment, more specifically, the filter coefficient F of the compensation filter **16*e* of the system, will be described with reference to FIGS. 6 and 16**, which show the speaker-to-microphone transfer characteristic mentioned above.

Focusing on the aspects that differ from the first embodiment, in the third embodiment, the distribution of the booming noise at the front and rear seats is utilized in designing the filter coefficient F. The design technique for the filter coefficient F in the first embodiment is limited to being able to control the increased sound generated at the rear seats when reducing the booming noise of the front seats. However, the technique of the third embodiment allows the booming noise at the front and rear seats to be reduced.

In the description given hereinafter, the error signal e in FIG. 16 mentioned above is expressed by equations (11) and (12) below. Y0, Y1, and Y"1 in FIGS. 6 and 16 and the equations indicate control signals inputted to the speakers.

$$e0=c00\cdot Y0+c10\cdot Y1+d0 \quad \text{(Eq. 11)}$$

$$e1=c01\cdot Y0+c11\cdot Y1+d1 \quad \text{(Eq. 12)}$$

The following equations can be obtained if the transfer characteristic from the evaluation point at which the microphone 22 is mounted to the pseudo or simulated evaluation point **16*f* at which the microphone 220** for the rear seats is mounted is designated as q.

$$d1=q\cdot d0 \quad \text{(Eq. 13)}$$

$$e1=q\cdot e0 \quad \text{(Eq. 14)}$$

The following equation can therefore be obtained from equations (11), (12), (13), and (14).

$$Y0(c01-q\cdot c00)=Y1(q\cdot c10-c11) \quad \text{(Eq. 15)}$$

If control can be performed such that F=Y"1/Y0 and Y"1=Y1 from FIG. 6, the noise reduction area does not change even if the number of microphones is reduced. Accordingly, an active noise cancellation can be effected that is capable of producing noise reduction effects in the pseudo or simulated evaluation point as well.

The filter coefficient F to be determined can therefore be expressed by the following equation from equation (15).

$$\begin{aligned} F &= Y''1/Y0 \quad \text{(Eq. 16)} \\ &= Y1/Y0 \\ &= (c01 - q\cdot c00)/(q\cdot c10 - c11) \end{aligned}$$

In the active noise cancellation system according to the third embodiment, since the prescribed value F of the compensation filter **16*e* that indicates the output ratio of the speakers (first canceling signal emitter) 20*f* at the front seats and the speakers (second canceling signal emitter) 20*r* at the rear seats can be determined as described above, in addition to the effects described in the first embodiment, the output ratio (canceling signal ratio) of both speakers 20*r* and 20*f* assumes a value at which the error signal at the pseudo or simulated evaluation point 16*f* is minimized, a system can be configured of a type that uses two microphones in a pseudo manner, and vibration or noise can be suppressed such that the error signal is minimized not only at the evaluation point that is the mounting position of the microphone 22, but also at the pseudo or simulated evaluation point 16*f***.

The active noise cancellation system according to a fourth embodiment of the present invention will next be described.

Figure 13:
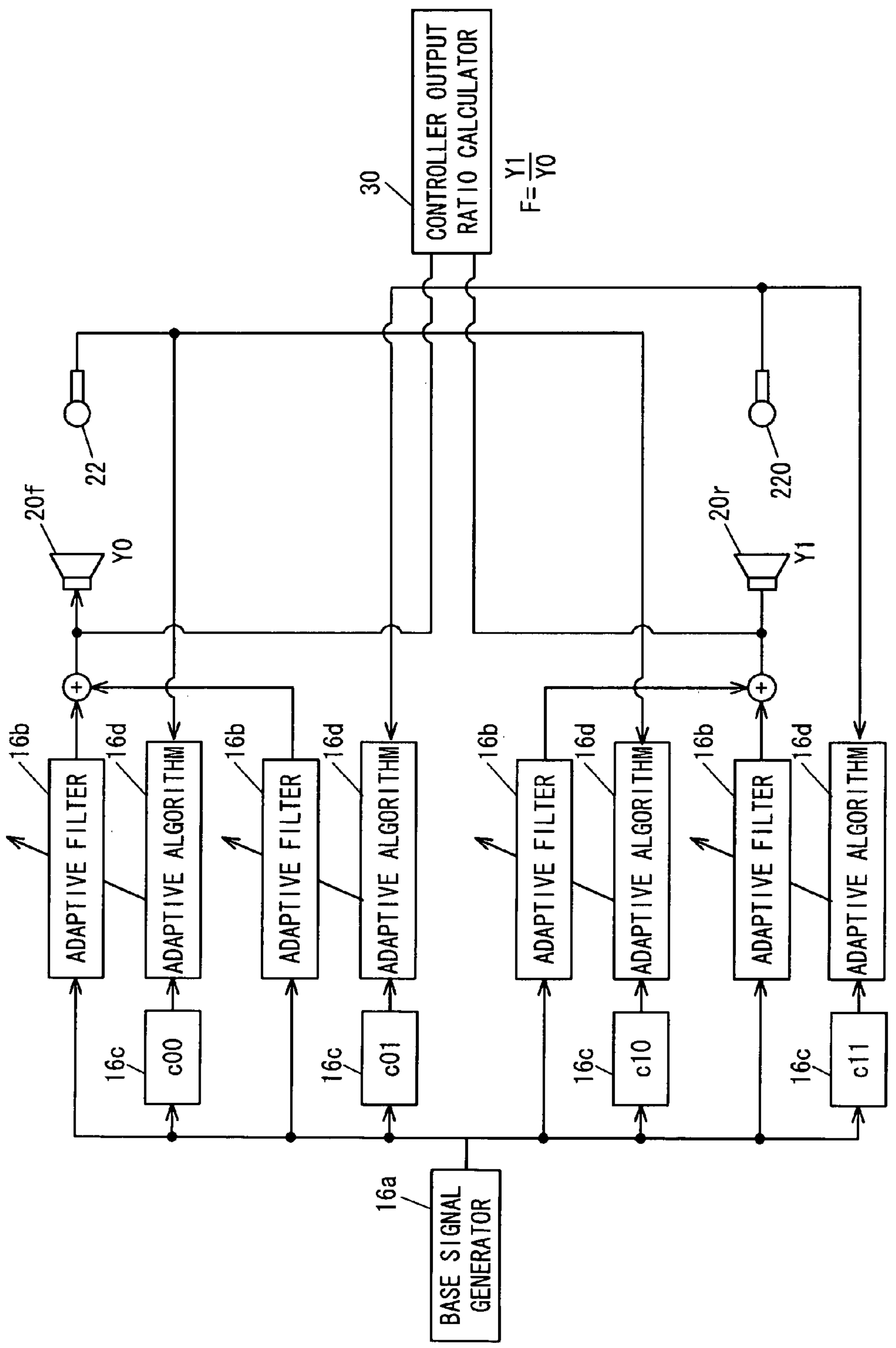
FIG. 13 is a view, similar to FIG. 4, but showing the configuration of the active noise cancellation system according to a fourth embodiment of the present invention.

FIG. 13 is a block diagram similar to FIG. 4, but showing the configuration of the active noise cancellation system according to the fourth embodiment.

In the fourth embodiment, a microphone 220 is temporarily placed at the rear seats when the compensation filter **16*e* is designed, the output ratio (speaker control signal ratio) Y1/Y0 of the controller 16 at that time is calculated or measured by a controller output ratio calculator 30, and the filter coefficient (prescribed value) F of the compensation filter 16*e* is set on the basis of the output ratio thus measured. Then, the microphone 220 at the rear seats is removed after the characteristic of the compensation filter 16*e*** is determined and the system is completed.

Thus, in the active noise cancellation system according to the fourth embodiment, the microphone 220 is temporarily placed at the pseudo or simulated evaluation point **16*f* that is set at a position apart from the evaluation point (where the front-seat microphone 22 is mounted), the error signal (pseudo or simulated error signal) at that position is detected, the output ratio (control signal ratio of speakers (first canceling signal emitter) 20*f* and speakers (second canceling signal emitter) 20*r*) (Y1/Y0) of the controller 16 is determined such that the sum of the pseudo or simulated error signal and the error signal e detected by the microphone (error signal detector) 22 is minimized, and the control signal ratio thus determined is designated as the filter coefficient (prescribed value) F of the compensation filter 16*e***.

As a result, in addition to the effects described in the first embodiment, the output ratio of both sets of speakers 20 becomes a value whereby the error signal at the pseudo or simulated evaluation point **16*f* is minimized, the system can be configured of a type that simulates the use of two microphones, and noise can be suppressed not only at the evaluation point, but also at the pseudo or simulated evaluation point 16*f***.

The active noise cancellation system according to a fifth embodiment of the present invention will next be described.

Figure 14:
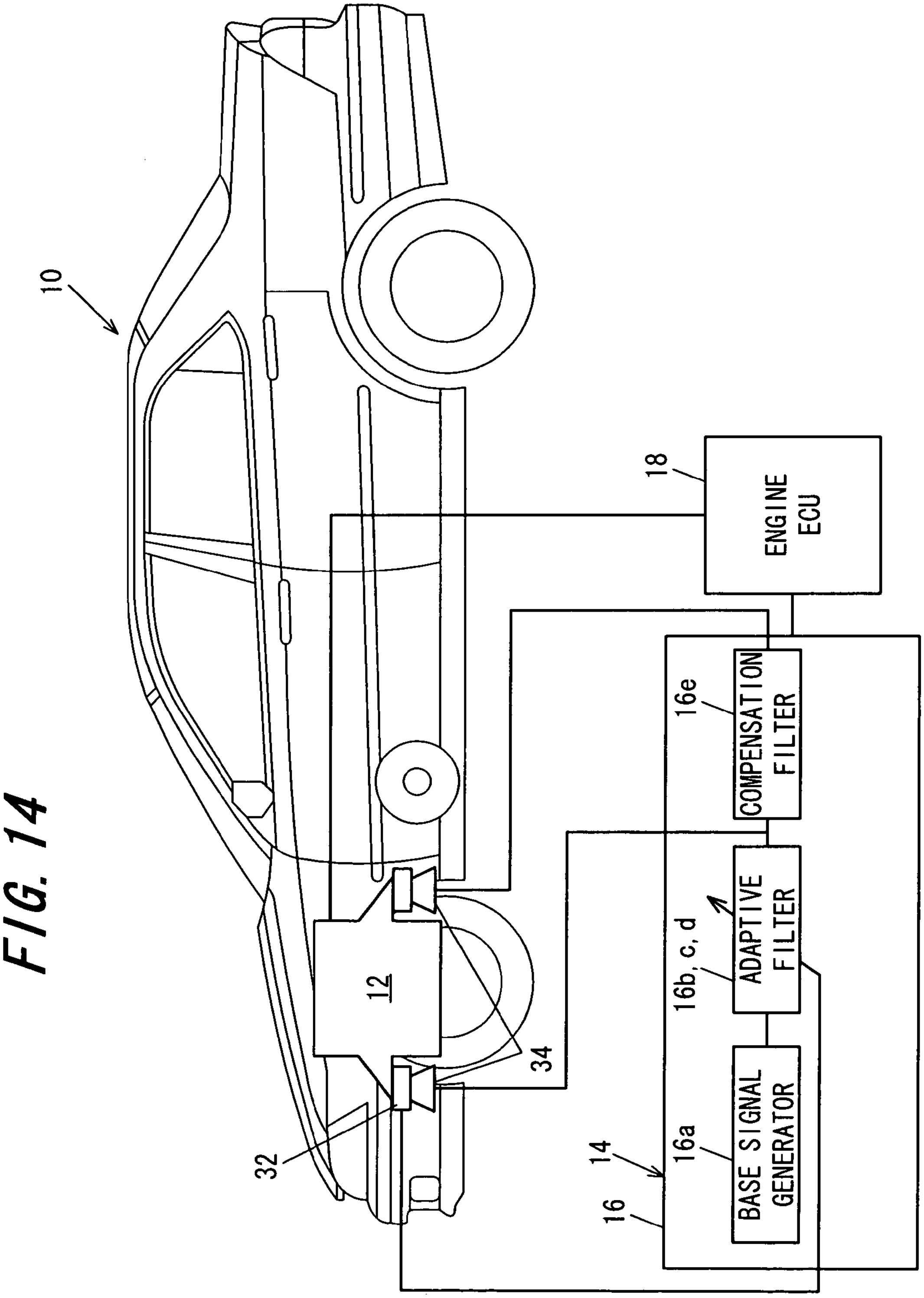
FIG. 14 is a view, similar to FIG. 2, but showing the configuration of the active noise cancellation system according to a fifth embodiment of the present invention.

FIG. 14 is a side view of the vehicle, similar to FIG. 2, but showing the active noise cancellation system according to the fifth embodiment of the present invention.

In the fifth embodiment, a pulse signal indicating the engine speed NE is inputted from the engine ECU 18 to the controller 16, and a detection value indicating the vibration of the engine 12 is also inputted thereto from a vibration detection sensor 32 disposed near the engine 10.

In the controller 16, a reference signal is generated from the base signal generated on the basis of the engine speed NE, a drive signal is determined so as to minimize the error signal (vibration) detected by the vibration detection sensor 32, and an engine mount 34 containing a vibrator or other actuator is driven by the drive signal. Vibration is thereby canceled or counteracted and reduced, and vibration or vibration-induced noise can be effectively reduced. Also, the remaining aspects of the configuration and operation of the controller 16 are the same as shown in FIG. 3 and other drawings.

The active noise cancellation system according to a sixth embodiment of the present invention will next be described.

Figure 15:
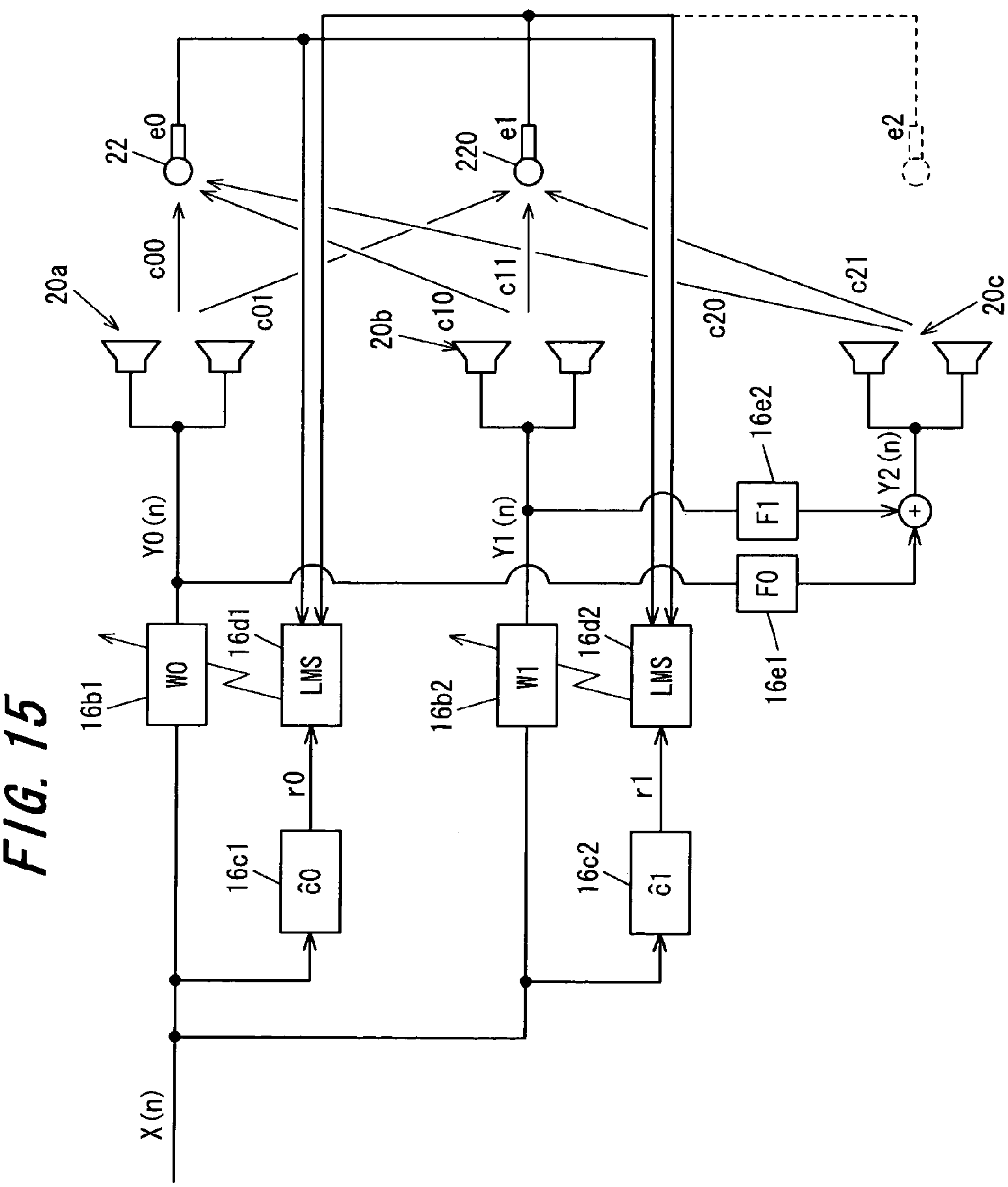
FIG. 15 is a view, similar to FIG. 5, but showing the configuration of the active noise cancellation system according to a sixth embodiment of the present invention.

FIG. 15 is a block diagram, similar to FIG. 5, but showing the configuration of the active noise cancellation system according to the sixth embodiment of the present invention.

In the foregoing embodiments, a configuration provided with two speakers (outputs), two adaptive filters, and two microphones are modified into a configuration having two speakers (outputs), one adaptive filter, and one microphone. The sixth embodiment involves a case in which the number of microphones is reduced when three microphones are provided.

Figure 18:
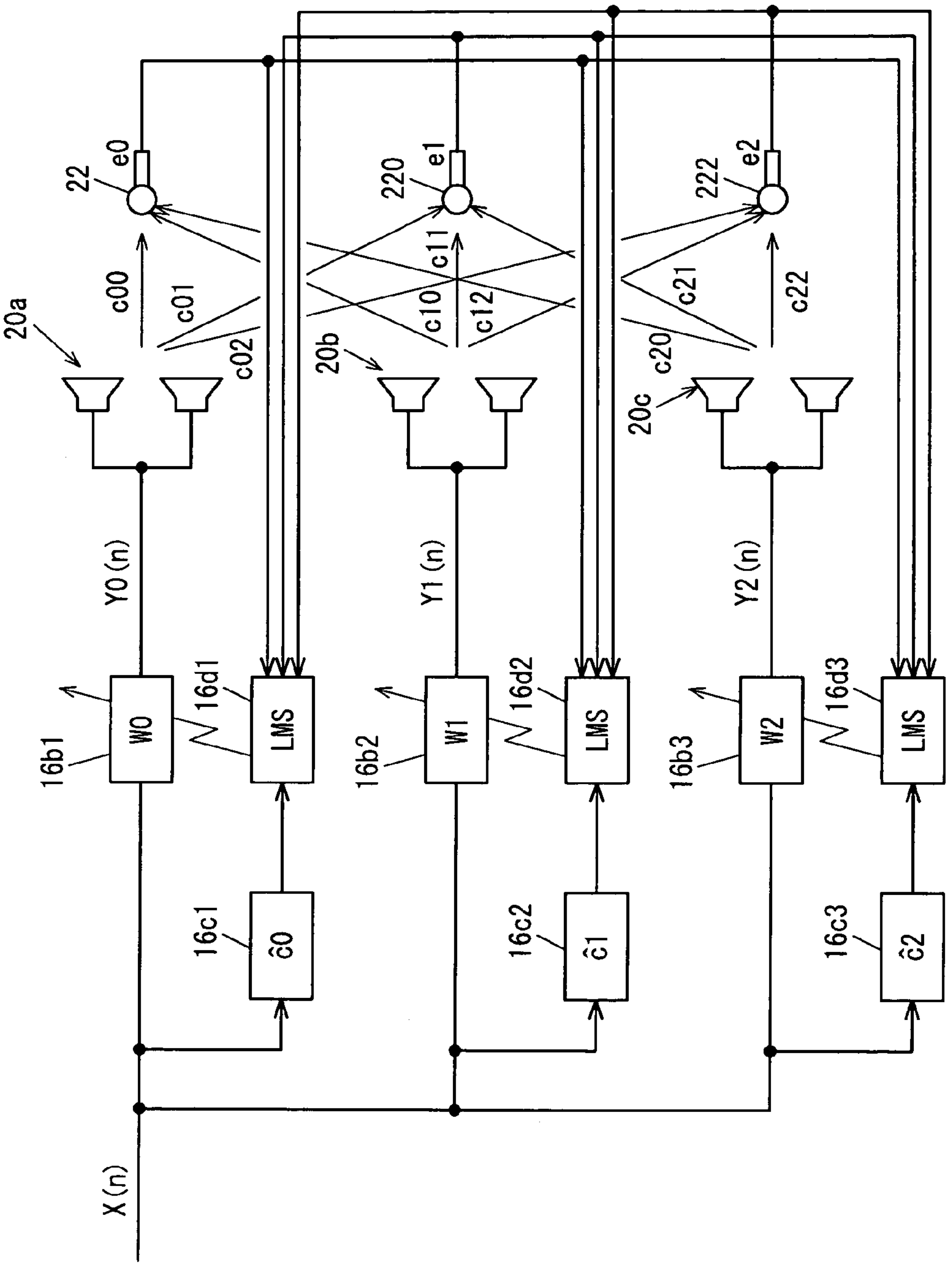
FIG. 18 is a block diagram showing the configuration of the prior art system in contrast with the configuration of the sixth embodiment illustrated in FIG. 15.

FIG. 18 is a block diagram showing the configuration of the prior art in which three microphones are provided. In the configuration shown in the figure, three microphones 22, 220, and 222 are provided in correlation with three speakers 20*a*, 20*b*, and 20*c*. In this case, the transfer coefficients for successively updating three adaptive filters are expressed as shown below.

$$c0=c00+c01+c02$$

$$c1=c10+c11+c12$$

$$c2=c20+c21+c22 \quad \text{(Eq. 17)}$$

In contrast, in the configuration according to the sixth embodiment shown in FIG. 15, the third microphone 222 is removed. Accordingly, the transfer coefficients for successively updating the two adaptive filters can be expressed as shown below.

$$c0=c00+c01+F0(c20+c21)$$

$$c1=c10+c11+F1(c20+c21) \quad \text{(Eq. 18)}$$

The system according to the sixth embodiment is thus provided with the base signal generator (not shown) that generates the base signal X composed of a harmonic frequency selected from the frequencies of noise generated from the noise source, adaptive filters 16*b*1 and 16*b*2 that output the control signals Y0 and Y1 based on the base signal X, three sets (a plurality) of speakers (canceling signal emitters) 20*a*, 20*b*, and 20*c* that emit or output the canceling signals for canceling out the aforementioned noise generated on the basis of the control signals, two microphones (error signal detectors) 22 and 220 that detect as the error signal e the residual vibration noise brought about by interference between the canceling signal and the noise in the evaluation point, correction filters 16*c*1 and 16*c*2 that correct the base signal by the correction value c that indicates the transfer characteristic (signal transfer characteristic) from the speakers 20 to the microphones 22 and 220 of the noise that corresponds to the frequency of the base signal X to generate the reference signals r0 and r1, and the adaptive algorithms (LMS; filter coefficient updater) 16*d*1 and 16*d*2 that successively or continually update the filter coefficients W0 and W1 of the adaptive filter 16*b* by the error signal e and reference signals r such that the error signal is minimized, and is also provided with compensation filters 16*e*1 and 16*e*2 that correct the control signal with the prescribed values F (filter coefficients F0 and F1).

Further, the speakers 20 are composed of speakers (canceling signal emitters) 20*a* and 20*b* that output the canceling signal generated based on the control signals Y0 and Y1, and speakers 20*c* that output the canceling signal generated based on the control signal Y2 that is the sum of the control signals Y"0 and Y"1 corrected by the compensation filters 16*e*1 and 16*e*2. The correction values (filter coefficients) c0 and c1 of the correction filters 16*c*1 and 16*c*2 are made as the sums obtained by adding together the transfer characteristics c00+c01 and c10+c11 from the speakers (first canceling signal emitter) 20*a* and 20*b* to the microphones (error signal detector) 22 and 220 and the product (F0·(c20+c21) and F1·(c20+c21)) of the aforementioned prescribed values F and the transfer characteristic (c20 +c21) from the speakers (second canceling signal emitter) 20*c* to the microphones (error signal detector) 22 and 220. Remaining aspects of this configuration and effects thereof are the same as in the embodiments heretofore described.

The present invention has been described in the embodiments using as an example a case in which the microphone at the rear seats is removed. However, since the concept of time lag disappears if a frequency domain is taken into account as in the second embodiment, this is the same as a case in which the microphone at the front seats is removed. Furthermore, a case is described in the sixth embodiment in which the number of microphones is reduced to two when three or more of them had been mounted, but it is apparent that the present invention is also applied to a case in which the number of microphones is reduced when four or more of them have been mounted.

Furthermore, although the present invention has been described using as an example a case in which vibration or noise is reduced inside the passenger compartment of a vehicle, the present invention is also applied to reducing vibration or noise in the cabin of an aircraft or the like.

Japanese Patent Application No. 2003-318362 filed on Sep. 10, 2003, is incorporated herein in its entirety.

While the invention has thus been shown and described with reference to specific embodiments, it should be noted that the invention is in no way limited to the details of the described arrangements changes and modifications may be made without departing from the scope of the appended claims.

What is claimed is:

1. An active noise cancellation system, comprising:

a base signal generator that generates a base signal composed of a harmonic having a frequency selected from a frequency of vibration or noise produced from a vibration or noise source;

an adaptive filter that outputs a control signal based on the base signal;

a first canceling signal emitter that emits a canceling signal for canceling out the vibration or noise generated based on the control signal;

an error signal detector that detects a residual vibration or noise at an evaluation point due to interference between the emitted canceling signal and the produced vibration or noise, as an error signal;

a correction filter that corrects the base signal, by a correction value indicating a transfer characteristic of the produced vibration or noise that corresponds to the harmonic frequency of the base signal from the first canceling signal emitter to the error signal detector, to generate a reference signal;

a filter coefficient updater that successively updates a filter coefficient of the adaptive filter based on the error signal and the reference signal such that the error signal is minimized;

a compensation filter that corrects the control signal by a prescribed value; and a second canceling signal emitter that emits the canceling signal generated based on the corrected control signal;

wherein the correction value of the correction filter is set to a sum obtained by adding the transfer characteristic from the first canceling signal emitter to the error signal detector, and a product obtained by multiplying the transfer characteristic from the second canceling signal emitter to the error signal detector by the prescribed value.

2. The system according to claim 1, wherein the prescribed value is determined based on a ratio between the transfer characteristic from the first canceling signal emitter to a pseudo point set at a position apart from the evaluation point and the transfer characteristic from the second canceling signal emitter to the pseudo point.

3. The system according to claim 1, wherein the prescribed value is determined as $(c01-q\cdot c00)/(q\cdot c10-c11)$, if defining the transfer characteristic from the evaluation point to a pseudo point set at a position apart from the evaluation point when the canceling signal is not emitted as q, the transfer characteristic from the first canceling signal emitter to the error signal detector as c00, the transfer characteristic from the first canceling signal emitter to the pseudo point as c01, the transfer characteristic from the second canceling signal emitter to the error signal detector as c10, and the transfer characteristic from the second canceling signal emitter to the pseudo point as c11.

4. The system according to claim 1, further including:

a pseudo error signal detector that detects a pseudo error signal at a pseudo point set at a position apart from the evaluation point; and a calculator that calculates a ratio of the canceling signals emitted from the first canceling signal emitter and the second canceling signal emitter such that a sum of the error signal detected by the error signal detector and the pseudo error signal detected by the pseudo error signal detector is minimized;

and wherein the prescribed value is determined to the calculated ratio.

5. The system according to claim 1, wherein the vibration or noise source is an internal combustion engine mounted on a vehicle.

* * * * *